United States Patent
Joshi et al.

(10) Patent No.: US 6,941,530 B2
(45) Date of Patent: Sep. 6, 2005

(54) METHOD OF CROSS-MAPPING INTEGRATED CIRCUIT DESIGN FORMATS

(75) Inventors: Hemant Joshi, Plano, TX (US); David A. Thomas, Sugar Land, TX (US); John Bach, Sugar Land, TX (US); Rand B. Carawan, Stafford, TX (US)

(73) Assignee: Texas Instruments Incorporated, Dallas, TX (US)

( * ) Notice: Subject to any disclaimer, the term of this patent is extended or adjusted under 35 U.S.C. 154(b) by 78 days.

(21) Appl. No.: 10/395,476

(22) Filed: Mar. 24, 2003

(65) Prior Publication Data

US 2004/0194040 A1 Sep. 30, 2004

(51) Int. Cl.[7] .............................................. G06F 17/50
(52) U.S. Cl. ................................ 716/4; 716/5; 702/94; 702/95
(58) Field of Search ................... 716/4–6, 19; 356/620; 324/758; 703/1; 702/94, 95

(56) References Cited

U.S. PATENT DOCUMENTS

| | | | | |
|---|---|---|---|---|
| 5,530,372 A | * | 6/1996 | Lee et al. | 324/758 |
| 5,675,499 A | * | 10/1997 | Lee et al. | 716/19 |
| 5,831,735 A | * | 11/1998 | Corby, Jr. | 356/620 |
| 6,629,065 B1 | * | 9/2003 | Gadh et al. | 703/1 |

OTHER PUBLICATIONS

R. Scharf et al., "DRC–Based Selection of Optimal Probing Points for Chip–Internal Measurements," IEEE, 1992, pp. 840–847.*
R. Scharf et al., "Layout Analysis and Automatic Test Point Selection for Fast Prototype Debug Using E–Beam or Laser–Beam Testsystems," IEEE, 1992, pp. 17.3.1–17.3.4.*
H.P. Ho, "Application of Dual Probe Direct Interference to Multilayered High Density Optical Storage: A Proposal," IEEE, Mar. 1997, pp. 621–622.*
Quintard et al., "Temperature Measurement of Metal Lines Under Current Stress by High–Resolution Laser Probing," IEEE, Feb. 1999, pp. 69–74.*
Chiu–sing et al., "Test Generation with Dynamic Probe Points in High Observability Testing Environment," IEEE, 1996, pp. 88–96.*
Lin et al., "A New Algorithm for CAD–Directed CMM Dimensional Inspection," IEEE, May 1998, pp. 893–898.*
Neil H.E. Weste and Kamran Eshraghian; *Principles of CMOS VLSI Design, A Systems Perspective Second Edition*; (85 p.); 1993. Only p. 381–461.
Edward I. Cole, Jr., Jerry M. Soden, James L. Rife, Daniel L. Barton and Christopher L. Henderson; *Novel Failure Analysis Techniques Using Photon Probing With A Scanning Optical Microscope*; IRPS, (11 p.); 1994.

* cited by examiner

*Primary Examiner*—Vuthe Siek
(74) *Attorney, Agent, or Firm*—Robert D. Marshall, Jr.; W. James Brady, III; Frederick J. Telecky, Jr.

(57) ABSTRACT

A method of cross-mapping integrated circuit ("IC") elements nets in a IC and/or directing a probe to points on an IC to achieve minimal interference from adjacent structures is disclosed. The method of provides a more streamlined approach than referencing points from a physical layout representation of the IC to the actual IC being tested. The improved correlation between the actual packaged IC and the layout of the IC is accomplished using artificial locator cells. Preferably, the artificial locator cells are generated from mathematical operations of the extracted version of the layout, and they further provide coordinate information for where minimal interference from adjacent structures may be accomplished. Artificial locator cells may be generated from a layout representing a hierarchical representation or alternately each element that is instantiated from a reference library may already have artificial locator cells included.

11 Claims, 4 Drawing Sheets

METHOD OF CROSS-MAPPING INTEGRATED CIRCUIT DESIGN FORMATS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to integrated circuit design. More particularly, the invention relates to techniques for cross-mapping integrated circuit design formats.

2. Background Information

The ubiquitous presence of integrated circuits ("ICs") in almost every electronic device is testament to their importance in today's society. An integral part of producing ICs is "failure analysis," which is the determination of why product failure is occurring. For example, if an IC has a current leakage path on an input/output pin, the pin may be deemed defective, but the actual root cause of the leakage current may still be unknown. Furthermore, it can be extremely difficult to determine exactly what is causing the defective IC to fail, especially when the IC has been packaged. IC technology trends only exacerbate this problem, as the number of transistors contained in each successive generation of ICs doubles approximately every eighteen months and more routing layers are required to connect tightly packed circuit elements. Methods for determining the root cause of the defective ICs may involve many levels of abstraction. For example, testing a packaged IC would entail high level of abstraction, whereas testing different points on the surface of the IC would entail a more detailed level of abstraction. Thus, the particular analysis used to determine the root cause of the problem is commensurate with the nature of the failure since some problems may be determined by testing the packaged IC, and other problems would require testing at the surface of the IC.

Figure 1A:
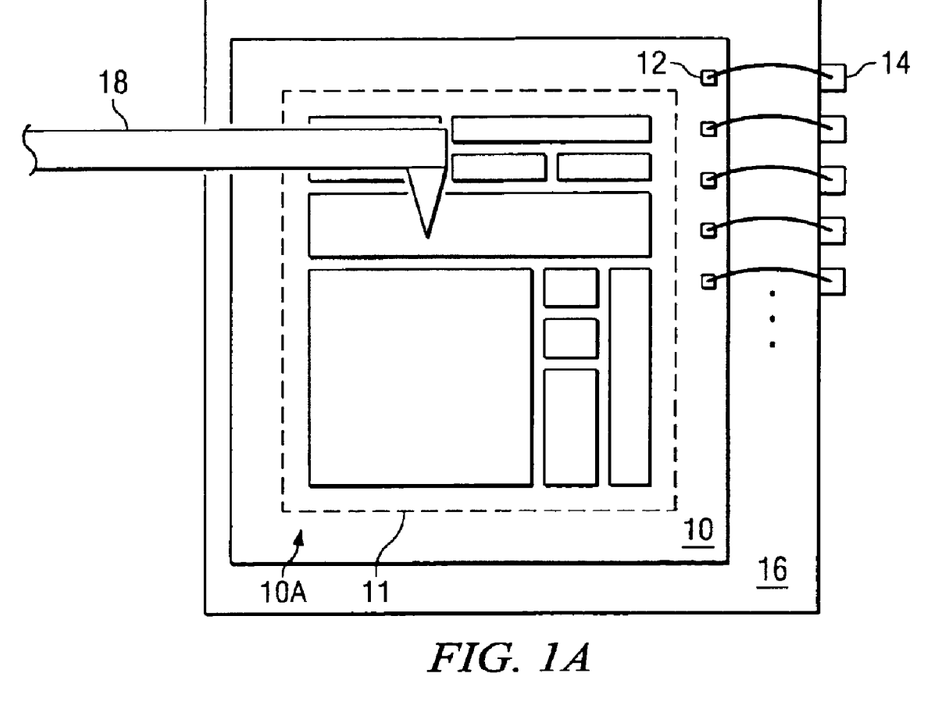
FIG. 1A shows a top down view of an IC in a non-flip-chip package being probed using a micro-mechanical probe;.
Figure 1B:
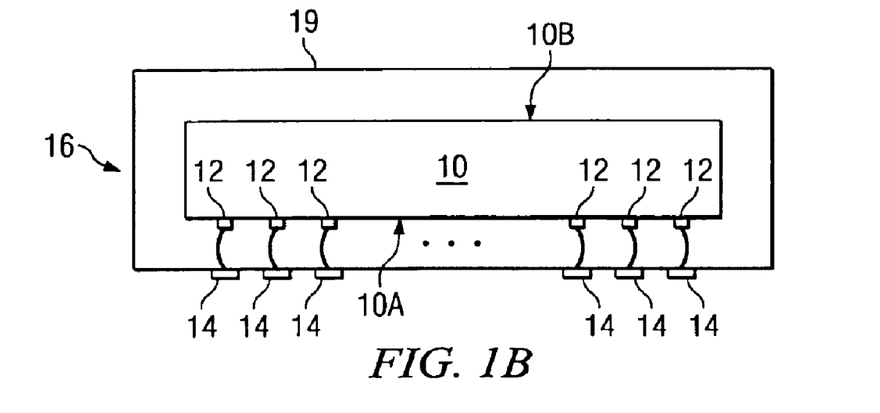
FIG. 1B shows a cross sectional view of a flip-chip packaged IC.

The basic functional testing of a packaged IC may be as simple as applying a voltage to the power pins, observing the level of current drawn by the packaged IC and checking that the current falls within specified limits. On the other hand, it may be necessary to test the operation of a specific circuit element (e.g., a single transistor) while the IC is operating, which, can be quite cumbersome when the IC is packaged in a "flip-chip" package because physical access to desired points on the IC via traditional probes is not possible. FIGS. 1A–1B help to illustrate this problem.

Referring now to FIG. 1A, an IC 10 is shown with circuits 11 integrated thereon. The IC 10 has circuitry 11 integrated on its frontside 10A, and includes bonding pads 12, which are used to make connections between the IC 10 and pins 14 of a package 16, which encapsulates the IC 10. The arrangement shown in FIG. 1A represents a top down view of a non-flip-chip configuration with the top of the package 16 removed so as to expose IC 10. In testing a non-flip-chip packaged IC such as the one shown in FIG. 1A, it is sometimes necessary to use a micro-mechanical probe 18 to perturb the states of individual transistors (i.e., toggling between "on" and "off" states) that are part of the circuitry 11. Because the IC 10 has been encapsulated in the package 16, the top layer of the package 16 is removed and access to the circuitry on the frontside 10A of the IC is then possible using the micro-mechanical probe 18. The micro-mechanical probe 18 has a needle like tip, (which can be on Me order of 1 $\mu$m) which is placed on the metal wires that couple the terminals of the desired transistor to other electrical devices. This procedure works relatively well when the frontside 10A of the IC 10 is accessible for probing with the mechanical probe 18, as seen in FIG. 1A.

However, packaging methods exist that orient the IC with the frontside 10A (which contains the circuitry) facing down. This is called "flip-chip" packaging. FIG. 1B shows a cross sectional view of a flip-chip package encapsulating IC 10, with its frontside 10A facing down and making connection between the bonding pads 12 and each pin 14 of the package 16. In this arrangement, access to the frontside 10A of the IC 10 cannot be gained by removing the top 19 of the packaging, as this would only yield access to its backside 10B, which does not contain any circuitry. Furthermore, the pins 14 of the flip-chip package 16 are in the form of conductive metal balls that span across the bottom of the package 16, so simply removing the bottom of the packaging to gain access to the circuitry with a micro-mechanical probe is impossible without completely removing the IC 10 from the flip-chip package 16, which is impractical.

One technique used in testing specific circuit elements that are not physically accessible with traditional probes uses an optical microscope/probe such as that described in, "Novel Failure Analysis Techniques Using Photon Probing With a Scanning Optical Microscope," by E. I. Cole Jr. et al., which is incorporated herein by reference. In general this technique uses an optical probe that produces infrared light to perturb the state of individual circuit elements (i.e., altering a transistor's state from "on" to "off," or vice versa) without actually making physical contact with the frontside of the IC. In order to accommodate the wavelengths of light used in the optical probe, the probe is directly applied to the backside of the IC, which, in a flip-chip arrangement, requires that the top of the flip-chip package be removed so as to expose the backside of the IC 10 to the light from the optical probe. Nevertheless, although the ability to probe any desired point is satisfied using an optical microscope/probe, finding the desired point in the IC to direct the probe to can still be like finding a needle in a haystack because physical access to the frontside of the IC is not available for viewing and navigating the optical probe. In addition, although the optical probe is capable of producing an image of the IC through the backside, often this image is not detailed enough to use in navigating the IC while looking for the desired probe point. This problem is only exacerbated by the millions of devices integrated in today's ICs, and thus, navigating the optical probe from an imprecise image can make it difficult to locate and probe the desired point.

In order to effectively use the optical probe, the desired point that needs to be perturbed is first found on the computer-automated drawing ("CAD") representation of the IC. This CAD representation of the IC depicts the arrangement of the various metal and polysilicon materials used in actually building the IC in the fabrication facilities (or "fabs"), and is a reproduction of what is seen when viewing the IC through a microscope. Therefore the CAD representation serves as a good "road map" for finding a desired point on the actual IC that is being tested. For example, the actual fabricated IC can be on the order of 9 mm$^2$, while the CAD representation can be printed as large as desired (e.g., 2 m$^2$). Further, the CAD representation is computer based making it easier to track the connectivity of electrical devices in determining the point of interest and generate the coordinates of that point. However, correlating between the point of interest on the CAD representation or "road map" and the actual IC in a non-flip-chip arrangement can be difficult because of the density of the electrical devices, and can be even more difficult in a flip-chip packaging arrangement because of the imprecise image obtained from the optical probe as described above.

In addition to encountering problems, With optical probing arrangements, navigating through the various integrated structures in an IC using other probing methods can be problematic also. For example, invasive probing techniques using fine probing needles (e.g., on the order of 1 $\mu$m) may not be able to probe down to desired probe points on the IC because of interference from adjacent integrated structures, such as metal routing layers. This can be especially problematic in high-density areas of the IC, and becomes more problematic with each successive version of ICs as more routing layers are used. Thus, a need exists for an effective mechanism to direct any probe to a desired point in on an IC with minimal interference from adjacent structures.

BRIEF SUMMARY OF THE PREFERRED EMBODIMENTS OF THE INVENTION

The problems noted above in large part are addressed by using "artificial locator cells" to cross-map the coordinates from the layout view of the IC and provide probe locations with minimal interference from adjacent structures. An artificial locator cell refers to a cell that is deliberately placed into the CAD representation, but is not used in fabricating the IC. In one embodiment the different layers of the layout have different computational functions performed on them in order to furnish possible probe points. For example, the polysilicon layer and the diffusion layer may have the NAND function performed on them so that the result generates polygons that represent the drain and source regions of MOSFETs. Alternatively, the polysilicon and diffusion layers may have mathematical operations performed on them such that the coordinates of where the two layers abut are revealed for probing. Nets used to interconnect circuit elements (e.g., logic gates, transistors, resistors, capacitors, etc.) of the IC could then be determined by examining the connections of these drain and source regions, and disregarding regions which are connected to power and ground rails. The coordinates of the generated polygons would then comprise points of interest to be used when probing a failing device. These coordinates may be saved in a file so that a probing tool may navigate to the desired coordinates more effectively. Preferably, the process of generating the artificial locator cells that correlate to IC locations is accomplished using software.

In one embodiment, the computational operations are performed on the highest level layout of the IC after the circuit elements have been instantiated from a reference library. Accordingly, the artificial locator cells are then placed in this highest level layout. Alternately, the artificial locator cells may be placed in varying degrees of layout hierarchy. As such, in another embodiment, the circuit elements contain the artificial locator cells prior to being instantiated in the highest level layout. For example, if a NAND gate is being instantiated into the higher level layout, it may already contain artificial locator cells over the regions representing the inputs and outputs of the gate. Upon instantiation into the higher level layout, the software could combine the outputs of one gate with the inputs of another gate to represent one single net that could be probed.

Regardless of the method of placing the artificial locator cell into the layout, or at what level of hierarchy the locator cells exist, all of the artificial locator cells preferably are compiled into a list using software. The software may also correlate the layout and artificial locator cell coordinates in the list to a netlist containing net names. Also, the software may consolidate multiple artificial locator cell coordinates that represent the same net such that the list generated is reduced in size. A probe may then be used to perturb and/or measure a point located at these coordinates, wherein the point may be referenced by net name, and a probing apparatus determines the coordinates using the net name. Accordingly, the possible probe points indicated by the artificial locator cells preferably indicate probe points with minimal interference from adjacent structures.

In another embodiment, a probing apparatus is used in testing ICs. The apparatus preferably comprises a central processor, a monitor, a storage device, a probe and software that positions the probe to a desired point using coordinate information from a correlation list. The list comprises coordinates of artificial locator cells and their corresponding connection from a netlist. Artificial locator cells are preferably determined using computational operations on a plurality of layers that are representative of the physical layout of the IC and may provide locations with minimal interference from adjacent integrated structures. The user of the apparatus would have the ability to specify the coordinates or the net name to position the apparatus to the desired point. Upon locating a point the probe may then perturb and/or measure its electrical characteristics.

BRIEF DESCRIPTION OF THE DRAWINGS

For a detailed description of the preferred embodiments of the invention, reference will now be made to the accompanying drawings, wherein like parts throughout the drawings are marked with the same reference numerals.

NOTATION AND NOMENCLATURE

Certain terms are used throughout the following description and claims to refer to particular system components. As one skilled in the art will appreciate, semiconductor companies may refer to processes, components, and sub-components by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either a direct or indirect electrical or wireless connection. Thus, if a first electrical element couples to a second electrical element, that connection may be through a direct electrical connection, or through an indirect electrical or wireless connection via other devices and connections.

The term "IC" refers to an integrated circuit fabricated upon a semiconductor substrate that has been diced. The term "device" refers to an IC that has been packaged for use on a circuit board. The "frontside" of the IC refers to the side of the IC that includes electrical devices that have been processed onto its surface through a series of fabrication steps. The "backside" of the IC refers to the side opposite the frontside and generally does not contain electrical devices. Thus, a frontside analysis technique is an analysis performed using the side of the IC that has been processed and now contains electrical devices, whereas a backside analysis technique uses the side of the IC that has not been processed to contain devices (also known as substrate side). The term "flip-chip" refers to a method of packaging ICs such that the frontside of the IC faces downward and the backside faces upward when placed into the package.

The term "netlist" refers to a list of electrical circuit elements as represented by a schematic and its interconnections. The term "physical layout" or "layout" refers to a CAD image or CAD view of an integrated circuit comprising various layer, which either directly or indirectly represent mask steps in the fabrication process. The term "extraction" refers to a process where the layout is transformed from different layers of arranged polygons into a netlist of electrical circuit elements.

The term "artificial locator cell" refers to a structure that is deliberately placed into the CAD representation, but is not used in fabricating the IC. The artificial locator cells may be combined to form an artificial locator layer. The artificial locator cells are formed by performing computational functions on layers in a CAD representation that are used for fabricating the IC.

To the extent that any term is not specially defined in this specification, the intent is that the term is to be given its plain and ordinary meaning.

DETAILED DESCRIPTION OF THE PREFERRED EMBODIMENTS

A preferred embodiment of the present invention provides cross-mapping capabilities between the coordinates from a CAD representation of an IC, and coordinates of desired probe points of the actual IC by generating artificial locator cells at the coordinates of the desired point. An "artificial locator cell" refers to a structure that is deliberately placed into the CAD representation, but is not used in fabricating the IC. Accordingly, the different layers of the CAD representation have different computational functions performed on them in order to generate the artificial locator cells and thereby furnish possible probe points. The resulting polygon coordinates preferably comprise points of interest to be used when probing a failing device. These points of interest are preferably the regions of abutment of at lest two layers of the layout.

Prior to delving into the preferred embodiments of the present invention, it is helpful to give a cursory review of IC design and implementation, and failure analysis techniques. A more detailed presentation of related concepts can be found in "Principles of CMOS VLSI Design," pp. 381–464, by Neil H. E. Weste et al., which is hereby incorporated by reference.

IC design begins with the abstract concept of accomplishing some function, which will require certain sub-operations. For example, a digital signal processor design will require, among other things, clock generation circuitry, memory, etc. The abstract concept is transformed in the design phase to a schematic or "netlist," which may represent simple designs including several hundred transistors, or more complicated designs including millions of transistors. During the transformation of an idea to an actual netlist, the netlist is simulated and tested to verify that the abstract concept is in fact being performed by the netlist within specified goals. For example, the netlist of the digital signal processor may be simulated to ensure that clock generation circuitry delivers the proper timing signals at the appropriate time.

Figure 2:
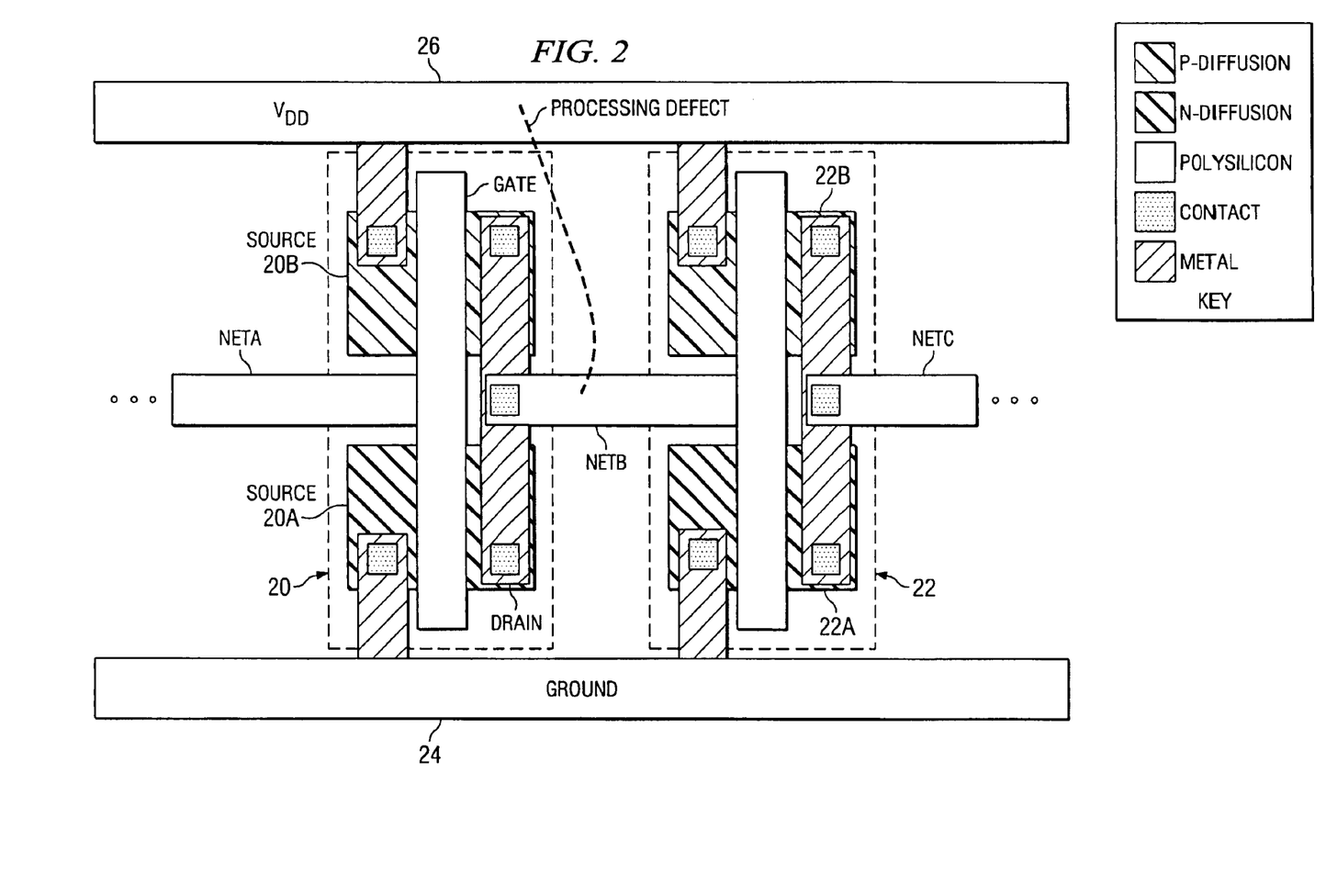
FIG. 2 shows an exemplary layout of two inverters coupled to each other.

Once the simulation is complete, a CAD representation or "layout" of the netlist is constructed using CAD-based software. In general, the layout represents the series of steps performed in a fab so as to construct integrated devices (e.g., transistors, resistors, and capacitors) on a semiconductor substrate in a hierarchical manner. Referring now to FIG. 2, exemplary layouts of an inverter 20 and another identical inverter 22 are shown coupled together, and a key explaining which particular layers are used is also included. For the sake of brevity, inverter 20 will be discussed but a similar discussion applies to inverter 22. Referring now to inverter 20, an n-type metal oxide semiconductor ("NMOS") transistor 20A is shown as defined by the n-type diffusion ("n-diffusion") region and a p-type metal oxide semiconductor ("PMOS") transistor 20B is shown defined by the p-type diffusion ("p-diffusion") region. It should be noted that the semiconductor substrate upon which the transistors are built is generally charge neutral such that the positive charge equals the negative charge. In addition, a diffusion region represents an area of the semiconductor substrate that has impurities deliberately introduced in order to influence the charge in that region to be either negative or positive. N-diffusion creates a region in the substrate that is rich in electrons, or negative charge carriers, whereas p-diffusion creates a region of the substrate that is rich in holes, or positive charge carriers. Thus, NMOS transistors have an overall negative charge, whereas PMOS transistors have an overall positive charge.

By using positive charge and negative charge transistors, basic logic functions can be implemented such that as a signal is applied to the input terminals of the transistors, they change from either conducting electricity or being "on," to not conducting electricity or being "off." For example, transistors 20A and 20B have their input terminals (called "gates") coupled together using polysilicon and forming a net labeled NETA. While the polysilicon serves many purposes, it can be thought of as a wire to conduct electricity between the gate terminal of the NMOS 20A and the PMOS 20B. When a voltage is applied to NETA, NMOS 20A and PMOS 20B react to either turn on or off in a complimentary fashion, such that when NMOS 20A is on and conducting electricity PMOS 20B is off and not conducting electricity, and vice versa. The NMOS 20A has a terminal (called the "source") that is coupled to the ground bus 24 using a metal line and a contact (where the contact facilitates the connection between the metal line and the n-diffusion region). On the other side of the gate terminal another terminal (called the "drain") of NMOS 20A is coupled to the drain terminal of the PMOS 20B. The drain terminals of NMOS 20A and PMOS 20B are shown coupled together using a metal line (and a contact to make connection between the diffusion regions and the metal line). This common connection between the two drain terminals is labeled NETB. A polysilicon line couples to this metal line with a contact and serves to further connect the output of inverter 20 to the input of inverter 22, or the gate terminals of NMOS 22A and PMOS 22B of inverter 22, thereby forming NETB. On the other side of the gate terminal of PMOS 20B, the source terminal of PMOS 20B is connected to the power bus 26. A processing defect is also shown in FIG. 2, as indicated by the dashed line, and will be discussed in detail below.

As described above, FIG. 2 shows an exemplary structure of two inverters coupled together where the actual layout is generally comprised of separate layers (e.g., diffusion, polysilicon, contacts, metal, etc.) of polygon patterns that are used in fabricating ICs. The layout may be hand generated for custom analog blocks like phase-locked loops, voltage regulators, and any other non-synthesizable blocks, which are sometimes referred to as "glue logic." Alternately, the layout may be computer generated or "synthesized" using reference libraries which contain basic logic blocks (e.g., NAND, NOR, NOT, etc.). For example, the netlist of a digital signal processor may contain references to inverters of varying strengths, which are to be used throughout its clock distribution network. When this netlist is synthesized, the appropriate inverters will be placed or "instantiated" in the physical layout from the reference library. Likewise, other blocks from the reference library are instantiated to create an overall layout of the entire IC, or top-level layout, which comprises the highest hierarchical level layout of the IC.

After a layout of the IC is generated all of the blocks are wired by hand and/or, by using software routing programs. At this point, two versions of the design exist, the netlist version that has been simulated and has passed the desired tests, and the physical layout version, which, due to metal wires shorting together or not making full contact with their intended connection point, may contain a myriad of connection-type errors. Manufacturers use the physical layout, and discrepancies between the physical layout and the simulated netlist can cause the manufactured part to be built differently than the netlist that has passed the desired tests, which is undesirable. Therefore, a layout-versus-schematic ("LVS") check is completed, traditionally using software, to ensure that there are no discrepancies between the physical layout and the netlist/schematic, which has been simulated. In performing a LVS check, the physical layout undergoes a conversion from a CAD view containing arranged polygons (e.g., FIG. 2) to a netlist format which describes the interconnectivity of devices. This process is known as "extraction," and typically generates an extracted netlist for comparison to the netlist that has passed the desired tests. For example, in generating an extracted netlist for the CAD representation of FIG. 2, the netlist would describe, among other things, the source of NMOS 20A connected to ground, the gate of NMOS 20A connected to NETA, and the drain of NMOS 20A connected to NETB (as described above).

Extraction is generally performed by taking the database representing the physical layout (e.g., FIG. 2) and examining the relationship between the polygons representing the different layers. For example, the overlap between the piece of polysilicon that forms the gate of NMOS 20A and PMOS 20B and the diffusion regions (i.e., p-diffusion and n-diffusion) defines the "size" or width and length of transistors NMOS 20A and PMOS 20B respectively. Various computational operations (e.g., Boolean functions, mathematical functions, etc.) can be performed on two or more disparate portions of a transistor to determine their overlap. Therefore, by performing certain computational operations on various polygons, information such as transistor sizes may be determined. For example, performing the AND operation on the polysilicon and diffusion layers of FIG. 2 gives the overlap between them and therefore yields the size of integrated MOSFET transistors.

After the layout is successfully extracted, the extracted version of the design is ready to be compared to the netlist by the LVS software, which may also associate the different net names from the netlist to the extracted version of the layout.

As mentioned above, failure analysis may involve different levels of abstraction, with more invasive approaches used in situations where the actual defect may be elusive. For example, a failure analysis engineer may start by performing a high level test on the input/output pins of the device, where the pin may undesirably be stuck at $V_{dd}$ or ground. This information often gives a general idea of where the root cause of the defective pin is located on the IC so that more detailed techniques can be employed to determine the root cause of failure. For example, invasive failure analysis approaches may be used to probe the IC with a probe needle or non-invasive optical probe techniques may be used.

A preferred embodiment of the present invention provides cross-mapping capabilities between the coordinates from the CAD representation of the IC and coordinates of desired probe points of the actual IC by generating artificial locator cells at the coordinates of desired points in the extracted netlist. The artificial locator cells may represent areas with minimal interference from adjacent structures. Multiple artificial locator cells may be generated at various desired locations on the IC, where the artificial locator cells are placed into an artificial locator layer similar to other layers that are present (e.g., the polysilicon layer). Computational functions can be performed on the various layers (e.g., polysilicon and diffusion), in order to define artificial locator cells and devices for use in identifying the location of a desired point for probing. The coordinates of the polygons resulting from the computational functions performed comprise points of interest to be used when probing a failing device. For example, by performing the NAND function on the polysilicon and diffusion (both the n-diffusion and the p-diffusion) layers of the layout, the drain and source of transistors may be defined. As illustrated in FIG. 2, with regard to NMOS 20A and PMOS 20B, the drain terminals of transistors used in logic gates are not connected to the power bus or ground bus directly, but rather serve to couple signals between the inputs and the outputs of logic gates. Also, in testing an IC, it is desirable to manipulate the state of logic gates by probing their inputs or outputs. By introducing an artificial locator cell at the coordinates of the drain region, the location of drain regions, and also the inputs and outputs of logic gates coupled to these drain regions, may be identified and probed regardless of the imprecise view afforded because of flip-chip packaging. Preferably, the coordinates of the artificial locator cells (which indicate desired probe points) are organized into a file where the signal names from the netlist may be cross-mapped for use in probing. In addition, there may be specific points of interest within the artificial locator cells such as the abutment of at least two layers, which provide additional probing benefits such as minimal interference with adjacent structures.

Figure 3:
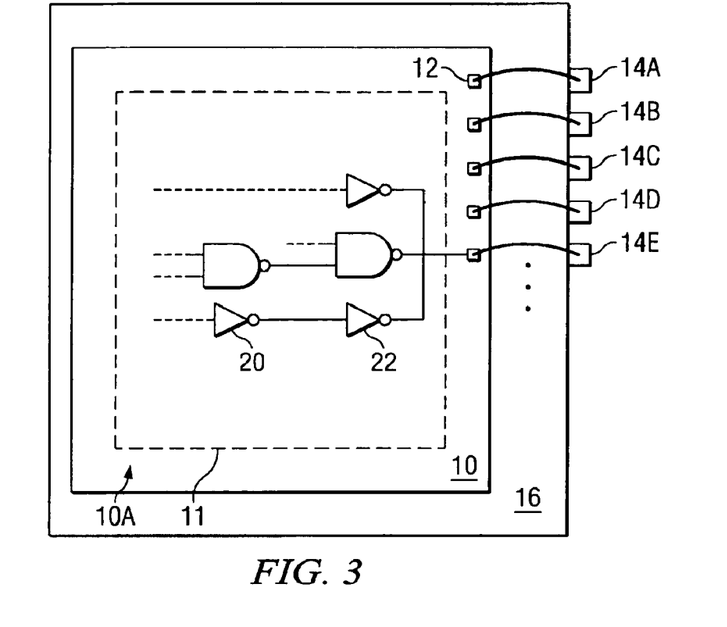
FIG. 3 shows an IC similar to FIG. 1 with the circuitry depicted as logic gates.

FIGS. 2–5 will now be discussed to illustrate an example of cross-mapping coordinates between a layout and an IC. Referring now to FIG. 3, an IC 10 is shown that is similar to the IC depicted and described in FIG. 1A except that the circuitry 11 is now represented with logic gates. In this depiction, IC 10 preferably comprises logic gates such as inverter 20 and inverter 22. (A possible layout of inverters 20 and 22 was previously shown in FIG. 2.) Assuming for the sake of example that during initial testing, the IC 10 was found to be defective because pin 14E is stuck at ground. Many devices may be coupled to pin 14E, including inverters 20 and 22, and so there are feasibly many different source of problems and thus many points of interest in determining this particular failure. Thus, in determining the root cause of the failure, it may be desirable to change the state of logic gates and/or measure different points that are coupled to pin 14E.

Figure 4:
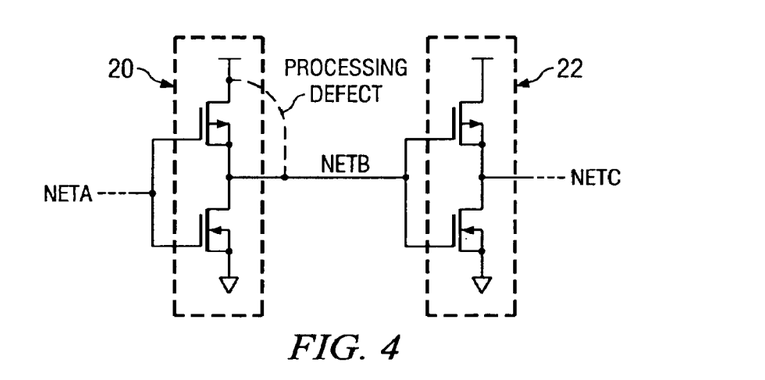
FIG. 4 shows a schematic representation of the inverters of shown in FIGS. 2 and 3.

Referring now to FIG. 4, a schematic representation is shown of inverters 20 and 22, including NETA, NETB and NETC, which all couple to pin 14E, which, is stuck at ground. Also, suppose also that NETB is tied high due to some processing defect as shown by the dashed line in FIG. 4, which results in pin 14E to be stuck at ground. This defect is also shown in FIG. 2. In order to detect this defect, the failure analysis engineer may want to toggle the voltage (using the probe as described above) at NETA and NETC between $V_{dd}$ and ground, while concurrently monitoring the state of pin 14E. If toggling the voltage at NETA does not change the state of pin 14E, and toggling the voltage at NETC does, then the engineer may then determine that the root cause of pin 14E being stuck at ground is a process defect on NETB.

Figure 5:
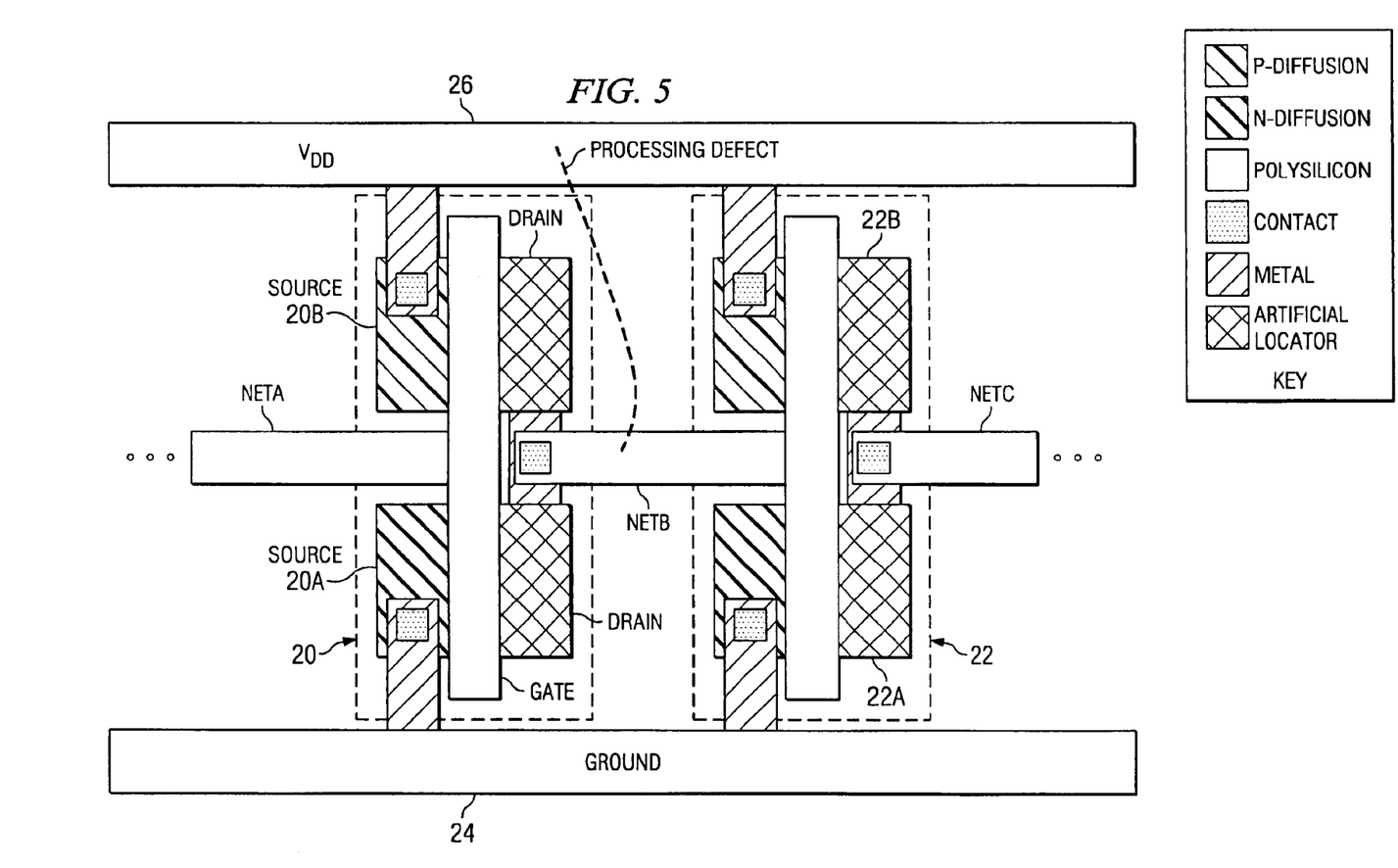
FIG. 5 shows a layout view of the inverters including artificial locator cells.

Referring now to FIG. 5, the layout of inverters 20 and 22 from FIG. 2 is shown including artificial locator cells that indicate the drain regions of the NMOS and PMOS devices. As discussed above, these drain regions are coupled to the input and output paths between inverters 20 and 22, and therefore give access to NETB. Note the artificial locator cell swatch has been added to the key and also appears over the drain regions of the NMOS and PMOS devices. The artificial locator cells shown in FIG. 5 are preferably created while extracting the layout of FIG. 2 for LVS purposes as described above. In performing the extraction, the polysilicon and diffusion (both the p-diffusion and n-diffusion) layers preferably have a NAND function performed on them in order to produce the drain and source regions of inverters 20 and 22. While the NAND function produces both the drain and the source regions contained in the layout, the connectivity information that comes from performing the LVS check is used to distinguish between the drain and source regions because the source regions are connected to either $V_{dd}$ or ground (as described above). Note that the artificial locator cell also indicates many possible coordinates for probing that fall within it. For example, it may be desirable to select certain sub-coordinates of the artificial locator cell to minimize interference from adjacent structures or utilize a portion of the IC that may be more sensitive to probing. Artificial locator cells are preferably placed into the extracted version of the layout, where the coordinates of the artificial locator cells represent the diffusion regions that are not attached to either $V_{dd}$ or ground. These artificial locator cells are ignored when performing the LVS check and are not interpreted as any type of electrical circuit element.

In another embodiment, the LVS connectivity information may be used to correlate the names of the nets (e.g., NETA, NETB, and NETC) to the actual artificial locator cell designating the coordinates for probing that net, and this correlation information may be saved to a file. In this manner, the failure analysis engineer may be able to refer to specific net names for probing purposes and have the coordinates associated with those net names (which are derived from individual artificial locator cells) provided to the probe tool automatically from the file that contains the cross-mapping information. In yet another embodiment, the list of artificial locator cells referencing a node may be consolidated. For example referring to FIG. 5, note that there are two drain regions, the drain of NMOS 20A and the drain of PMOS 20B, which may be used to refer to NETB. Thus, consolidating these two artificial locator cells such that only one of the two represents NETB may be desirable so that the size of the correlation file may be reduced.

In addition, since reference libraries (including logic gates) are often used in synthesizing designs as described above, the logic gates within the library may already have artificial locator cells in them before the design is extracted. For example, when IC 10 is synthesized, it may instantiate physical layouts of logic gates that already contain artificial locator cells. Thus, in one embodiment the artificial locator cells may be included in the logic gates prior to instantiation, whereas in another embodiment, the artificial locator cells may be added at a higher level layout after the logic gates have been instantiated. Regardless of the level of hierarchy at which the artificial locator cells are applied, a compiling step is preferably performed so that the coordinates of the artificial locator cells are mapped to net names in a correlation file. Thus in probing the IC, net names may be referred to and the probing apparatus may locate the desired probe point using the correlation file.

Figure 6:
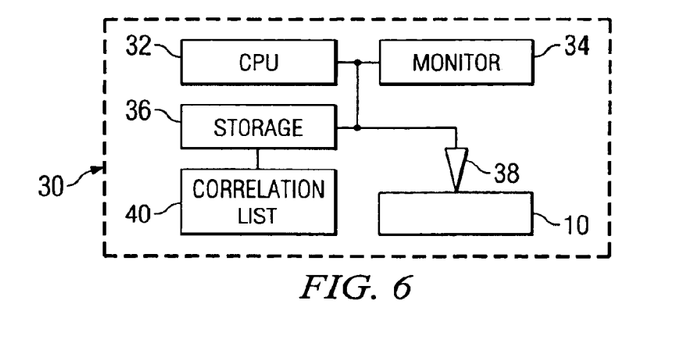
FIG. 6 shows an apparatus used in probing and testing ICs.

In another embodiment, as shown in FIG. 6, a probing apparatus 30 is used in testing ICs. The apparatus 30 preferably comprises a central processing unit ("CPU") 32, a monitor 34, a storage device 36, and a probe 38, all of which are coupled together. The storage device 36 may be any type (i.e., hard disk, CD-ROM, memory, etc.) and preferably contains software (not shown) executed by CPU 32, which positions the probe 38 to a desired point on the IC 10 by using coordinate information from a correlation, list 40. The list 40 comprises coordinates of artificial locator cells and their corresponding connections from a netlist. Artificial locator cells are preferably determined using computational operations on a plurality of layers that are representative of the physical layout of the IC 10. The user of the apparatus 30 would have the ability to specify the coordinates or the net name to position the apparatus 30 to the desired point. Upon locating a point the probe may then perturb and/or measure its electrical characteristics.

By and large, cross-mapping between the CAD representation of the IC and the coordinates of desired probe points of the actual IC may be accomplished by generating artificial locator cells (preferably during the extraction and LVS check), at the coordinates of the desired points. Performing computational functions on the different layers of the CAD representation generates the artificial locator cells, which may be later formed into artificial locator layers at the highest level representation of the layout. The coordinates of the artificial locator cells may be correlated to the names of nets during the LVS check, and this correlation information may be stored in a file, which may later be used when probing. By including and correlating the net names in this manner, a probing apparatus may now locate the coordinates of the net names upon specification of a net name. The artificial locator cells may be generated on cells before they are instantiated into the layout, or the layout may have computational functions performed on it to generate the artificial locator cells. By cross-mapping probe points between the actual IC and the CAD representation, probing flip-chip packaged ICs may be tested more efficiently.

The above discussion is meant to be illustrative of the principles and various embodiments of the present invention. Numerous variations and modifications will become apparent to those skilled in the art once the above disclosure is fully appreciated. For example, one of ordinary skill in the art having the benefit of this disclosure would recognize that actual extraction (as typically used in LVS operations) is not necessary for producing the artificial locator cells, and that processing the layout prior to performing the computational operations would suffice. In addition, a user may also manually insert the artificial locator cells into the layout without the aid of software. Also, the computational operations discussed above may be performed on layers other than diffusion and polysilicon, including more than two layers. In this manner, it is possible to implement an artificial locator cell over any terminal of any circuit element (e.g., nodes of resistors, transistors, capacitors, etc.) allowing any point on the IC to be probed. Furthermore, as would be familiar to one of ordinary skill in the art, the specific computational operations performed are not limited to the Boolean or mathematical functions and may be any combination of the complex algorithms serving to minimize interference from adjacent layout structures. In fact, depending on the desired probe points multiple layers may have multiple computational functions performed on them concurrently. Additionally, although this disclosure centers on CMOS devices and processes, one of ordinary skill in the art would recognize that artificial locator cells would provide useful in other technology types (e.g., Bipolar, Bi-CMOS, etc.) Also, the principles described herein may be applied to a variety of probing techniques (e.g., both invasive and non-invasive) so as to facilitate directing the probe to a desired point on an IC with minimal interference from adjacent structures. It is intended that the following claims be interpreted to embrace all such variations and modifications.

What is claimed is:

1. A method for determining probe points from a physical layout of an integrated circuit ("IC") having multiple layers of material representing the physical layout of the IC, comprising:

(a) retrieving a plurality of layers of said IC from the layout;

(b) performing computational operations on the plurality of layers to produce artificial locator cells that are not physically present in the IC and which have coordinates useable in probing; and (c) perturbing a logic state of the circuitry located at the coordinates of the artificial locator cells using an optical probe.

2. The method of claim 1, wherein each artificial locator cell generated in (b) is ignored by layout versus schematic ("LVS") software.

3. The method of claim 1, wherein:

the physical layout includes elements of a reference library; and said step of performing computational operations on the plurality of layers to produce said artificial locator cells operates to place at least one artificial locator cell within at least one element of the reference library.

4. The method of claim 1, wherein the plurality of layers retrieved in (a) comprise diffusion and polysilicon layers.

5. The method of claim 1, wherein the artificial locator cells define a region that is not connected to power or ground busses.

6. The method of claim 5, wherein the region comprises the drain terminals of metal oxide semiconductor field effect transistors ("MOSFETs").

7. A probing apparatus used in testing ICs, comprising:

a processor;

a monitor coupled to said processor;

a storage device coupled to said processor;

a probe controllable by said processor;

memory coupled to said processor and containing software that positions the probe to a coordinate of an IC using coordinate information from a correlation list, wherein the correlation list comprises coordinates of artificial locator cells that are not physically present in the IC, and the correlation list also contains the corresponding connection information of the artificial locator cells from a netlist; and the probe operable to perturb a logic state of circuitry a point located at the coordinates.

8. The apparatus of claim 7, wherein the artificial locator cell coordinates comprise the drain terminals of MOSFETs.

9. A computer readable storage medium for storing an executable set of software instructions that are executable by a processor, said software instructions being operable to position a probe to a desired probe location on an IC, said software comprising:

(a) means for processing a physical layout representing the IC into a plurality of layers;

(b) means for performing computational operations on the plurality of layers, wherein the computational operations produce at least one artificial locator cell not physically present in the IC and having coordinates used in probing;

(c) means for correlating the artificial locator cell's location to the desired probe point, comprising generating a correlation list, wherein the correlation list maps net names to possible probe locations; and (d) means for reading a net name and determining from a correlation list the desired probe location; and (e) means for perturbing a logic state of circuitry a point located at the coordinates.

10. The computer readable storage medium of claim 9 wherein each artificial locator cell generated in (c) is ignored by LVS software.

11. The computer readable storage medium of claim 9 wherein:

the physical layout of (a) comprises elements of a reference library; and said means for performing computational operations on the plurality of layers of (b) operates to place at least one artificial locator cell within at least one element of the reference library.

* * * * *